(12) United States Patent
Baude et al.

(10) Patent No.: US 6,897,164 B2
(45) Date of Patent: *May 24, 2005

(54) APERTURE MASKS FOR CIRCUIT FABRICATION

(75) Inventors: Paul F. Baude, Maplewood, MN (US); Patrick R. Fleming, Lake Elmo, MN (US); Michael A. Haase, St. Paul, MN (US); Tommie W. Kelley, Coon Rapids, MN (US); Dawn V. Muyres, St. Paul, MN (US); Steven Theiss, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/076,174

(22) Filed: Feb. 14, 2002

(65) Prior Publication Data

US 2003/0150384 A1 Aug. 14, 2003

(51) Int. Cl.[7] .............................................. H01L 21/31
(52) U.S. Cl. .................. 438/780; 438/942; 438/943
(58) Field of Search ............................. 438/401, 551, 438/671, 717, 725, 780, 942, 943, 948, 850; 427/96.8, 97.3, 154, 155, 255.28, 282; 118/504, 505, 720, 721

(56) References Cited

U.S. PATENT DOCUMENTS

| | | | |
|---|---|---|---|
| 3,669,060 A | 6/1972 | Page et al. | |
| 4,096,821 A | 6/1978 | Greeneich et al. | |
| 4,335,161 A | 6/1982 | Luo | |
| 4,676,193 A | 6/1987 | Martin | |
| 4,684,435 A | 8/1987 | Kishi et al. | |
| 4,746,548 A | 5/1988 | Boudreau et al. | |
| 4,915,057 A | 4/1990 | Boudreau et al. | |
| 4,963,921 A | 10/1990 | Kariya et al. | |
| 5,154,797 A | 10/1992 | Blomquist et al. | |
| 5,397,607 A | 3/1995 | Shields et al. | |
| 5,534,969 A | * 7/1996 | Miyake | ........................ 355/53 |
| 5,626,784 A | 5/1997 | Simons | |
| 5,682,228 A | * 10/1997 | Miyake | ........................ 355/75 |

(Continued)

FOREIGN PATENT DOCUMENTS

| | | |
|---|---|---|
| DE | 31 28 982 A1 | 2/1983 |
| EP | 1 003 221 A2 | 5/0000 |
| EP | 0 118 576 | 12/1987 |
| EP | 0719 638 A2 | 7/1996 |
| GB | 2 276 589 A | 10/1994 |
| JP | 61 130480 | 6/1986 |
| JP | 5-228669 | 9/1993 |
| JP | 9-27454 | 1/1997 |
| WO | WO 99/09456 | 2/1999 |
| WO | WO 99/30336 | 6/1999 |
| WO | WO 99/39373 | 8/1999 |
| WO | WO 99/54786 | 10/1999 |

OTHER PUBLICATIONS

Brody, "Large Area Masking Techniques for Thin Film Transistor Arrays," SPIE, vol. 100, Semiconductor Microlithography II, pp. 140–150(1977).

(Continued)

*Primary Examiner*—George Fourson
*Assistant Examiner*—Brook Kebede
(74) *Attorney, Agent, or Firm*—Lisa P. Fulton (57) ABSTRACT

Aperture masks and deposition techniques for using aperture masks are described. In addition, techniques for creating aperture masks and other techniques for using the aperture masks are described. The various techniques can be particularly useful in creating circuit elements for electronic displays and low-cost integrated circuits such as radio frequency identification (RFID) circuits. In addition, the techniques can be advantageous in the fabrication of integrated circuits incorporating organic semiconductors, which typically are not compatible with wet processes.

10 Claims, 9 Drawing Sheets

U.S. PATENT DOCUMENTS

| | | | |
|---|---|---|---|
| 6,087,196 | A | 7/2000 | Sturm et al. |
| 6,106,627 | A | 8/2000 | Yializis |
| 6,224,448 | B1 | 5/2001 | Tada et al. |
| 6,255,775 | B1 | 7/2001 | Ikuko et al. |
| 6,259,408 | B1 * | 7/2001 | Brady et al. ......... 343/700 MS |
| 6,285,001 | B1 | 9/2001 | Fleming et al. |
| 6,589,382 | B2 * | 7/2003 | Clark et al. .............. 156/304.3 |
| 2001/0023090 | A1 | 9/2001 | Lee |
| 2001/0026975 | A1 * | 10/2001 | Ando .......................... 438/253 |
| 2002/0062785 | A1 | 5/2002 | Kim et al. |
| 2002/0102811 | A1 * | 8/2002 | Farrow et al. .............. 438/401 |
| 2002/0111035 | A1 | 8/2002 | Atobe et al. |
| 2003/0150384 | A1 * | 8/2003 | Baude et al. ............... 118/721 |
| 2003/0151118 | A1 * | 8/2003 | Baude et al. ................ 257/620 |
| 2003/0160325 | A1 * | 8/2003 | Yoneda et al. .............. 257/758 |

OTHER PUBLICATIONS

Weimer, "The TFT—A New Thin–Film Transistor," Proceedings of the IRE, pp. 1462–1469(1962).

Brody et al., "Flexible Thin–Film Transistors Stretch Performance, Shrink Cost," Research, pp. 20–23 (1969).

Schon et al., "Fast Organic Electronic Circuits Based on Ambipolar Pentacene Field–Effect Transistors," Applied Physics Letters, vol. 79, No. 24, pp. 4043–4044 (2001).

Gouy et al., "Deposition of Organic Semiconductor Through Silicon Shadow Masks for Integrated Led on Silicon,", "date unknown".

Kim et al., "Photoplastic Shadow–Masks for Rapid Resistless Multi–Layer Micropatterning", Jun. 2001.

Kim et al., "Dry–Lift–Off Patterning on Fragile Surfaces Using MEMS Shadow Masks," pp. 619–622, Aug. 2000.

* cited by examiner

APERTURE MASKS FOR CIRCUIT FABRICATION

TECHNICAL FIELD

The invention relates to fabrication of circuits and circuit elements, and more particularly to deposition techniques using aperture masks.

BACKGROUND

Circuits include combinations of resistors, diodes, capacitors and transistors linked together by electrical connections. Thin film integrated circuits include a number of layers such as metal layers, dielectric layers, and active layers typically formed by a semiconductor material such as silicon. Typically, thin film circuit elements and thin film integrated circuits are created by depositing various layers of material and then patterning the layers using photolithography in an additive or subtractive process which can include a chemical etching step to define various circuit components. Additionally, aperture masks have been used to deposit a patterned layer without an etching step.

SUMMARY

In general, the invention is directed to deposition techniques using flexible, repositionable polymeric aperture masks to create integrated circuits or integrated circuit elements. The techniques involve sequentially depositing material through a number of polymeric aperture masks formed with patterns that define layers, or portions of layers, of the circuit. In some embodiments, circuits can be created solely using aperture mask deposition techniques, without requiring any of the etching or photolithography steps typically used to form integrated circuit patterns. The techniques can be particularly useful in creating circuit elements for electronic displays such as liquid crystal displays and low-cost integrated circuits such as radio frequency identification (RFID) circuits. In addition, the techniques can be advantageous in the fabrication of integrated circuits incorporating organic semiconductors, which typically are not compatible with photolithography or other wet processes.

In various embodiments, the invention is directed to different repositionable aperture masks such as flexible aperture masks, free-standing aperture masks and polymeric aperture masks formed with patterns that define a layer or a portion of a layer of an integrated circuit. Repositionable polymeric aperture masks may have a thickness of approximately between 5 and 50 microns or approximately between 15 and 35 microns. The various deposition apertures in the aperture masks may have widths less than approximately 1000 microns, less than approximately 50 microns, less than approximately 20 microns, less than approximately 10 microns, or even less than approximately 5 microns. Apertures of these sizes are particularly useful in creating small circuit elements for integrated circuits. Moreover, one or more gaps between deposition apertures may be less than approximately 1000 microns, less than approximately 50 microns, less than approximately 20 microns or less than approximately 10 microns, which is also useful in creating small circuit elements. Also, aperture masks that include a pattern having a width greater than approximately 1 centimeter, 25 centimeters, 100 centimeters, or even 500 centimeters are also described. Patterns having these widths can be useful in creating various circuits over a larger surface area as described in greater detail below. In some embodiments, the invention is directed to methods of depositing material on a deposition substrate through the repositionable polymeric aperture masks.

In other embodiments, the invention is directed to various techniques for creating or using the masks described above. For example, various laser ablation techniques are described that facilitate the creation of polymeric aperture masks having the patterns of deposition apertures described above. In addition, stretching techniques and other techniques are described to facilitate alignment of flexible polymeric aperture masks. Furthermore, methods of controlling sag in aperture masks are also described, which can be particularly useful in using masks that include a pattern that extends over a large width.

The various embodiments of the invention can provide a number of advantages. For example, the invention can facilitate the creation of relatively small circuit elements using deposition processes. The invention can facilitate circuit elements having widths less than approximately 1000 microns, less than approximately 50 microns, less than approximately 20 microns, less than approximately 10 microns, or even less than approximately 5 microns. Also, the invention can facilitate the creation of relatively large circuit patterns, in some cases having circuit elements of the relatively small widths mentioned above that cover large areas (such as 10 square centimeters, 50 square centimeters, 1 square meter, or even larger areas). In addition, the invention can reduce costs associated with circuit fabrication, and in the case of organic semiconductors, can even improve device performance. Polymeric aperture masks can be created using a laser ablation process that may be faster and less expensive than other techniques. Also, inexpensive polymeric materials can allow the polymeric masks to be disposable, although reusable embodiments are also described.

In addition, polymeric material may be well suited to be impregnated with magnetic material. In that case, the magnetic material may be used to reduce sag in the mask as described below. Furthermore, polymeric material is often stretchable, which allows the mask to be stretched to either reduce sag or to align the mask as outlined below.

Details of these and other embodiments of the invention are set forth in the accompanying drawings and the description below. Other features, objects, and advantages of the invention will become apparent from the description and drawings, and from the claims.

BRIEF DESCRIPTION OF DRAWINGS

FIG. 1b is an enlarged view of a portion of the aperture mask in FIG. 1a.

DETAILED DESCRIPTION

Figure 1A:
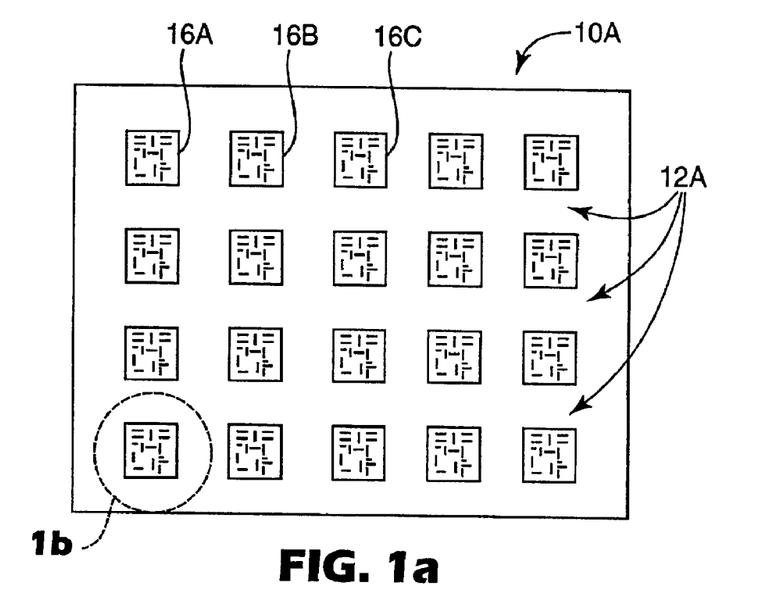
FIG. 1a is a top view of an aperture mask according to an embodiment of the invention.

FIG. 1a is a top view of an aperture mask according to the invention. In exemplary embodiments, aperture mask 10A is formed from a polymer material such as polyimide or polyester. However, in some embodiments, where aperture mask 10A is flexible, other flexible non-polymeric materials may be used. The use of polymeric materials for aperture mask 10A can provide advantages over other materials, including ease of fabrication of aperture mask 10A, reduced cost of aperture mask 10A, and other advantages. As compared to thin metal aperture masks, polymer aperture masks are much less prone to damage due to the accidental formation of creases or permanent bends. Furthermore, some polymer masks can be cleaned with acids.

Figure 1B:
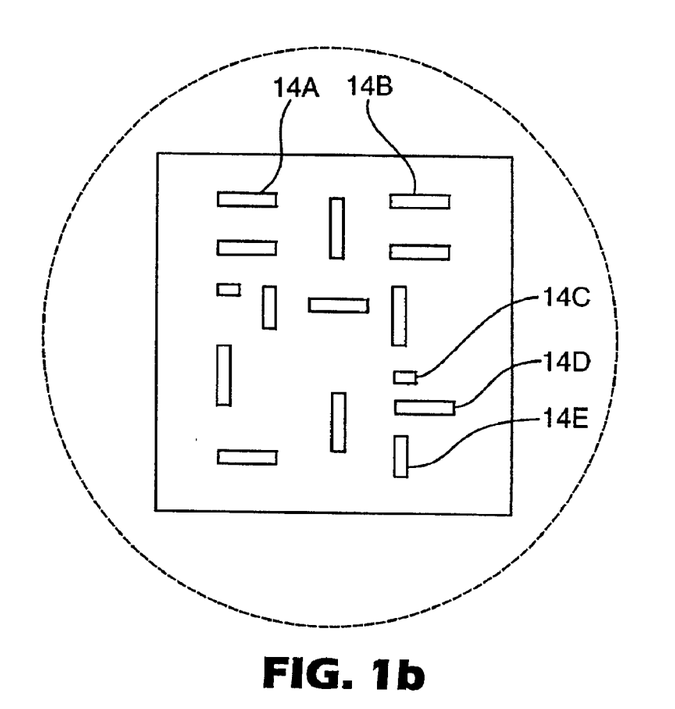

As shown in FIGS. 1a and 1b, aperture mask 10A is formed with a pattern 12A that defines a number of deposition apertures 14 (only deposition apertures 14A–14E are labeled). The arrangement and shapes of deposition apertures 14A–14E in FIG. 1b are simplified for purposes of illustration, and are subject to wide variation according to the application and circuit layout envisioned by the user. Pattern 12A defines at least a portion of a circuit layer and may generally take any of a number of different forms. In other words, deposition apertures 14 can form any pattern, depending upon the desired circuit elements or circuit layer to be created in the deposition process using aperture mask 10. For example, although pattern 12A is illustrated as including a number of similar sub-patterns (sub-patterns 16A–16C are labeled), the invention is not limited in that respect.

Aperture mask 10A can be used in a deposition process, such as a vapor deposition process in which material is deposited onto a deposition substrate through deposition apertures 14 to define at least a portion of a circuit. Advantageously, aperture mask 10A enables deposition of a desired material and, simultaneously, formation of the material in a desired pattern. Accordingly, there is no need for a separate patterning step preceding or following deposition. Aperture mask 10A can be particularly useful in creating circuits for electronic displays, low-cost integrated circuits such as RFID circuits, or any circuit that implements thin film transistors. Moreover, circuits that make use of organic semiconductors can benefit from various aspects of the invention as described in greater detail below.

One or more deposition apertures 14 can be formed to have widths less than approximately 1000 microns, less than approximately 50 microns, less than approximately 20 microns, less than approximately 10 microns, or even less than approximately 5 microns. By forming deposition apertures 14 to have widths in these ranges, the sizes of the circuit elements may be reduced. Moreover, a distance (gap) between two deposition apertures (such as for example the distance between deposition aperture 14C and 14D) may be less than approximately 1000 microns, less than approximately 50 microns, less than approximately 20 microns or less than approximately 10 microns, to reduce the size of various circuit elements. When making, using, reusing, or repositioning the aperture masks the distances between features, such as the distance between apertures or the distance between sub-patterns may be reproducible to within approximately 1.0 percent, approximately 0.5 percent, or even approximately 0.1 percent.

As described in greater detail below, laser ablation techniques may be used to define pattern 12A of deposition apertures 14. Accordingly, formation of aperture mask 10A from a polymeric film can allow the use of fabrication processes that can be less expensive, less complicated, and/or more precise than those generally required for other aperture masks such as silicon masks or metallic masks. Moreover, because laser ablation techniques can be used to create pattern 12A, the width of pattern 12A can be made much larger than conventional patterns. For example, laser ablation techniques can facilitate the creation of pattern 12A such that a width of pattern 12A is greater than approximately one centimeter, greater than approximately 25 centimeters, greater than approximately 100 centimeters, or even greater than approximately 500 centimeters. These large masks, which can be the width of a web, and very long, e.g., the length of a roll, can then be used in a deposition process to create circuit elements that are distributed over a large surface area and separated by large distances.

Figure 2:
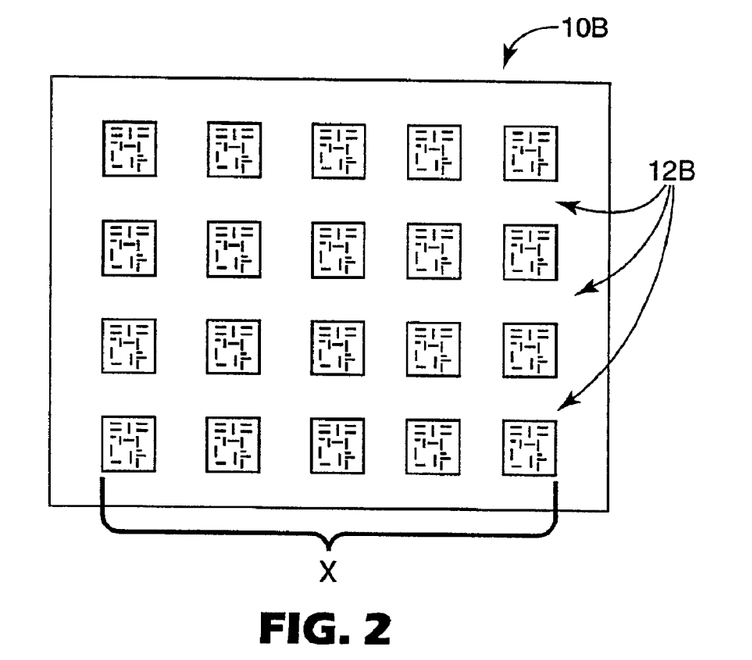
FIGS. 2 and 3 are top views of aperture masks according to an embodiment of the invention.
Figure 3:
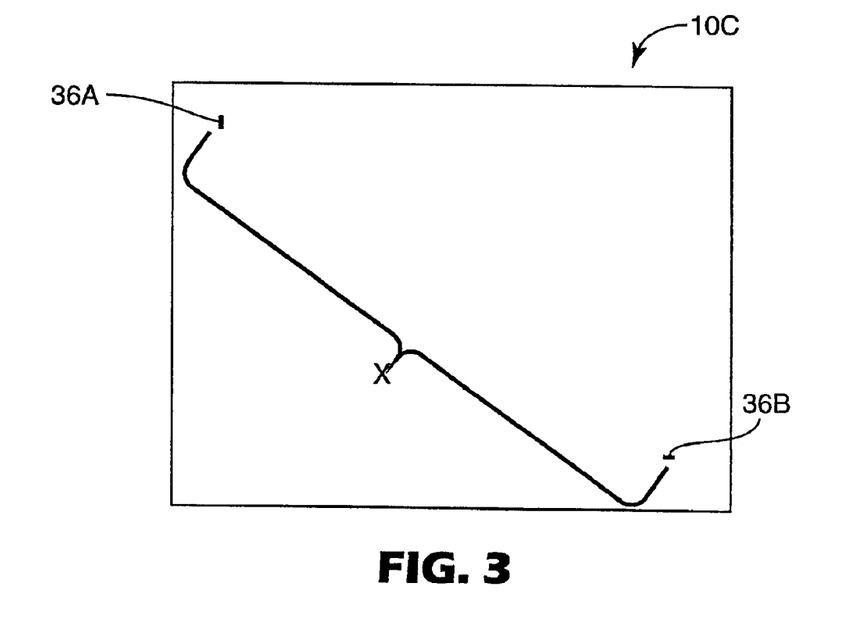

FIGS. 2 and 3 are top views of aperture masks 10 that include deposition apertures separated by relatively large widths. In particular, FIG. 2 illustrates aperture mask 10B, which includes a pattern 12B of deposition apertures. Pattern 12B may define at least one dimension that is greater than approximately one centimeter, 25 centimeters, 100 centimeters, or even greater than approximately 500 centimeters. In other words, the distance X may be within those ranges. In this manner, circuit elements separated by larger than conventional distances can be created using a deposition process. This feature may be advantageous, for example, in the fabrication of large area flat panel displays or detectors.

For some circuit layers, complex patterns may not be required. For example, aperture mask 10C of FIG. 3 includes at least two deposition apertures 36A and 36B. In that case, the two deposition apertures 36A and 36B can be separated by a distance X that is greater than approximately one centimeter, 25 centimeters, 100 centimeters, or even 500 centimeters. Again, laser ablation techniques can facilitate the relatively large distance X because laser ablation systems can be easily designed to facilitate patterning over the large areas. Moreover, laser ablation techniques can facilitate the creation of deposition apertures 36A and 36B to widths less than approximately 1000 microns, less than approximately 50 microns, less than approximately 20 microns, less than approximately 10 microns, or even less than approximately 5 microns. In that case, the deposition process would not necessarily require the aperture mask to be registered or aligned to a tolerance as small as the aperture widths. Still, the ability to deposit a circuit layer in a single deposition process with elements separated by these large distances can be highly advantageous for creating circuits that require large separation between two or more elements. Circuits for controlling or forming pixels of large electronic displays are one example.

Figure 4:
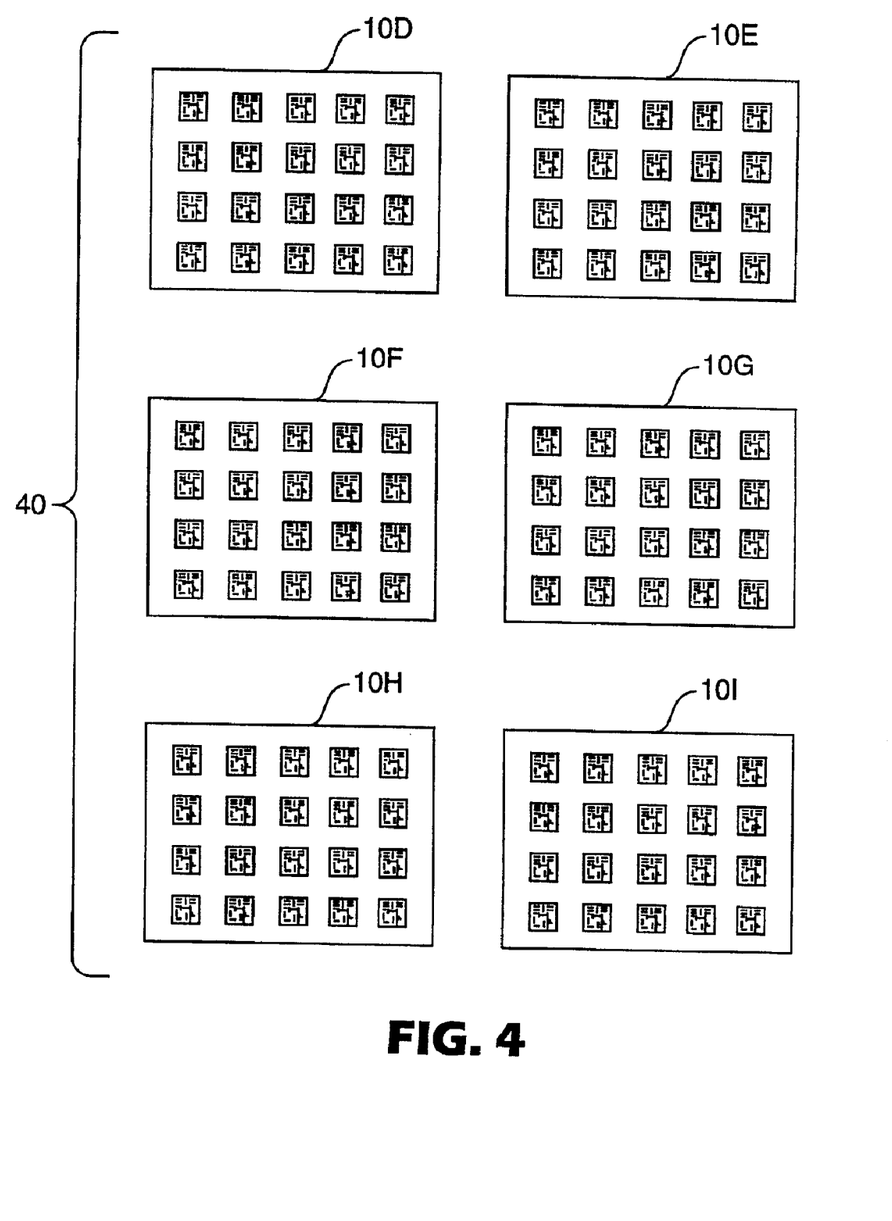
FIG. 4 is a top view of an exemplary mask set according to the invention.

FIG. 4 is a top view of a mask set 40 that includes a number of aperture masks 10D–10I according to the invention for use in a deposition process. Mask set 40 may include any number of polymeric aperture masks, for example, depending on the circuit or circuit element to be created in the deposition process. Masks 10D–10I form a "set" in the sense that each mask may correspond to a particular layer or set of circuit elements within an integrated circuit. Each aperture mask 10 can be formed with a pattern of deposition apertures that define at least part of a layer of a circuit. For example, a first aperture mask 10D may be formed with a first pattern of deposition apertures that define at least part of a first deposition layer of a circuit, while a second aperture mask 10E may be formed with a second pattern of deposition apertures that define at least part of a second deposition layer of the circuit. The mask set 40 may be used to create a wide variety of integrated circuits, such as integrated circuits which include both n-channel and p-channel thin film transistors (TFTs), such as a complimentary TFT element. In addition, organic or inorganic semiconductor materials may be used to create integrated circuits according to the invention. For some circuits, both organic and inorganic semiconductors may be used.

In some cases, the first and second aperture masks 10D and 10E may define different layers of a circuit, and in other cases, first and second aperture masks 10D and 10E may define different portions of the same circuit layer. In some cases, stitching techniques can be used in which first and second aperture masks 10D and 10E define different portions of the same circuit feature. In other words, two or more masks may be used in separate depositions to define a single circuit feature. Stitching techniques can be used, for example, to avoid relatively long deposition apertures, closed curves or any aperture pattern that would cause a portion of the aperture mask to be poorly supported, or not supported at all. In a first deposition, one mask forms part of a feature, and in a second deposition, another mask forms the remainder of the feature.

Each aperture mask 10 in mask set 40 may comprise a polymer. In that case, laser ablation techniques can be used to form one or more deposition apertures having widths less than approximately 1000 microns, less than approximately 50 microns, less than approximately 20 microns, less than approximately 10 microns, or even less than approximately 5 microns. In addition, at least two deposition apertures in each aperture mask may be separated by a gap less than approximately 1000 microns, less than approximately 50 microns, less than approximately 20 microns, or less than approximately 10 microns. Apertures and gaps between apertures of these dimensions can reduce circuit size, and in some cases improve circuit performance. Also, a dimension of the pattern of deposition apertures of aperture masks 10D–10I in mask set 40 may be in the ranges mentioned above to facilitate the creation of circuits having large dimensions.

Polymeric aperture masks are useful with a wide variety of materials to be deposited. For example, organic or inorganic materials may be deposited through polymeric aperture masks. In one example, amorphous silicon may be deposited. Deposition of amorphous silicon typically requires high temperatures greater than approximately 200 degrees Celsius. Some embodiments of the polymeric aperture masks described herein may be able withstand these high temperatures, thus allowing amorphous silicon to be deposited through the polymeric mask to create integrated circuits or integrated circuit elements.

Figure 5:
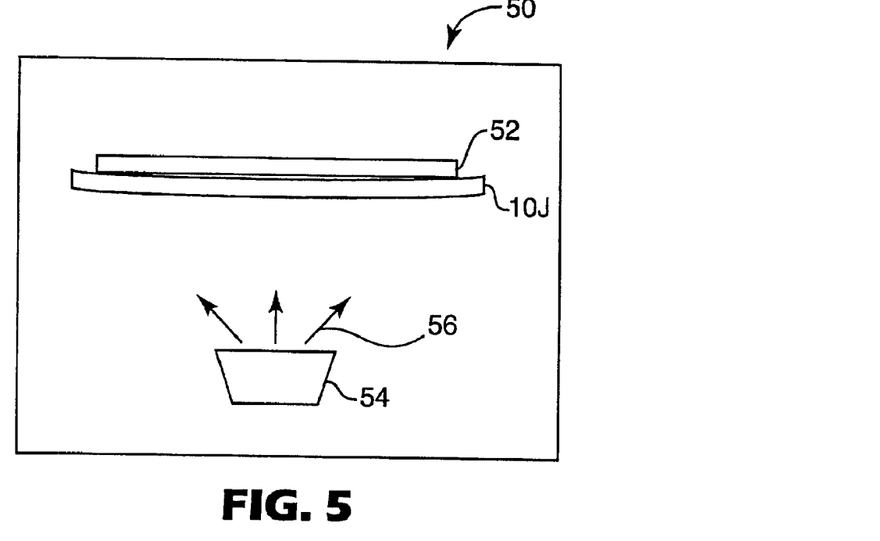
FIG. 5 is a block diagram of a deposition station using an aperture mask according to the invention.

FIG. 5 is a simplified block diagram of a deposition station that can use aperture masks in a deposition process according to the invention. In particular, deposition station 50 can be constructed to perform a vapor deposition process in which material is vaporized and deposited on a deposition substrate through an aperture mask. The deposited material may be semiconductor material such as an organic or inorganic semiconductor, dielectric material, or conductive material used to form a variety of elements within an integrated circuit. Other materials could also be used. Flexible aperture mask 10J is placed in proximity to a deposition substrate 52. In one example, flexible aperture mask 10J is sufficiently flexible such that it can be wound upon itself. In another example, flexible aperture mask 10J is sufficiently flexible such that it can be wound to a radius of curvature of less than approximately 1 centimeter without damage, or without forming a permanent bend. Deposition substrate 52 may comprise any of a variety of materials depending on the desired circuit to be created. For example, deposition substrate 52 may comprise a flexible material, such as a flexible polymer. Additionally, if the desired circuit is a circuit of transistors for an electronic display, deposition substrate 52 may comprise the backplane of the electronic display. Any deposition substrates such as glass substrates, silicon substrates, rigid plastic substrates, flexible plastic substrates, metal foils coated with insulating layers, or the like, could also be used.

Deposition station 50 is typically a vacuum chamber. After flexible aperture mask 10J is placed in proximity to deposition substrate 52, material 56 is vaporized by deposition unit 54. For example, deposition unit 54 may include a boat of material that is heated to vaporize the material. The vaporized material 56 deposits on deposition substrate 52 through the deposition apertures of flexible aperture mask 10J to define at least a portion of a circuit layer on deposition substrate 52. Upon deposition, material 56 forms the pattern defined by flexible aperture mask 10J. Flexible aperture mask 10J may include deposition apertures and gaps that are sufficiently small to facilitate the creation of small circuit elements using the deposition process as described above. Additionally, the pattern of deposition apertures in flexible aperture mask 10J may have a large dimension as mentioned above. Other suitable deposition techniques include e-beam evaporation and various forms of sputtering and pulsed laser deposition.

However, when flexible aperture mask 10J is made sufficiently large, for example, to include a pattern that has large dimensions, a sag problem may arise. In particular, when flexible aperture mask 10J is placed in proximity to deposition substrate 52, flexible aperture mask 10J may sag as a result of the gravitational pull on flexible aperture mask 10J. This problem is most apparent when the aperture mask 10J is positioned underneath deposition substrate as shown in FIG. 5. Moreover, the sag problem compounds as flexible aperture mask 10J is made larger and larger. FIG. 5 illustrates the sag problem that results from gravitational pull on flexible aperture mask 10J.

Figure 6:
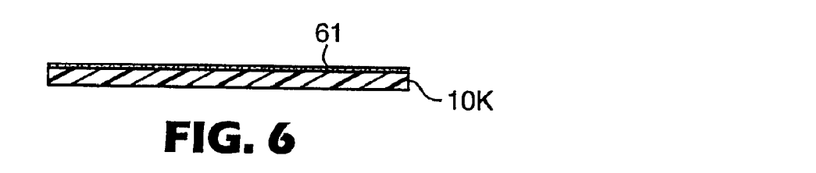
FIG. 6 is a cross-sectional side view of an aperture mask according to an embodiment of the invention.

The invention may implement one of a variety of techniques to address the sag problem or otherwise control sag in aperture masks during a deposition process. For example, FIG. 6 is a cross-sectional side view of a flexible aperture mask 10K having a first side 61 that can removably adhere to a surface of a deposition substrate to facilitate intimate contact between the aperture mask and the deposition substrate during the deposition process. In this manner, sag can be controlled or avoided. In particular, first side 61 of repositionable flexible aperture mask 10K may include a pressure sensitive adhesive. In that case, first side 61 can removably adhere to a deposition substrate via the pressure sensitive adhesive, and can then be removed after the deposition process.

Figure 7:
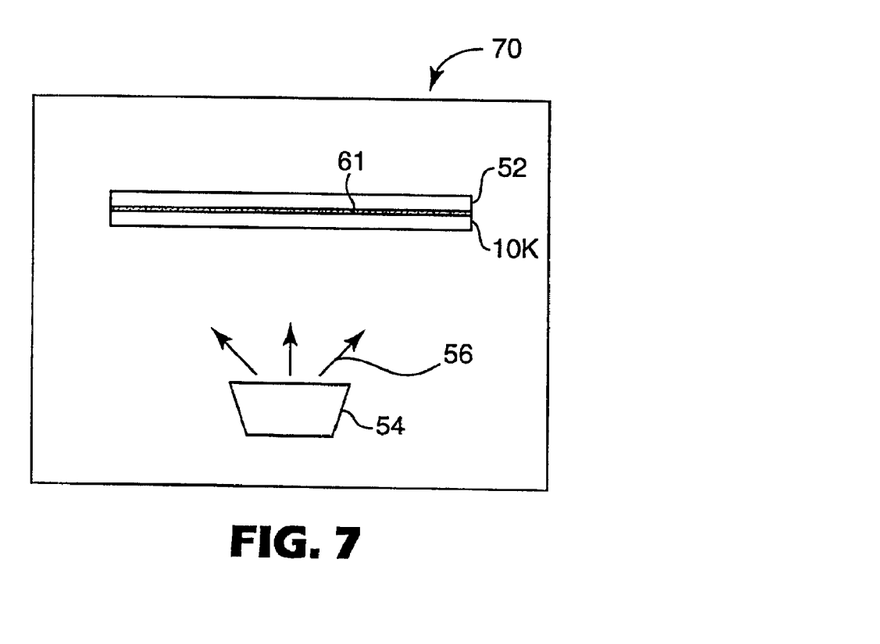
FIGS. 7 and 8 are additional block diagrams of deposition stations using an aperture mask according to the invention.

FIG. 7 is a block diagram of a deposition system 70 making use of flexible aperture mask 10K illustrated in FIG.

6. As shown, the sag problem is overcome because first side 61 of flexible aperture mask 10K adheres to deposition substrate 52. Material 56 can then be vaporized by deposition unit 54 and deposited onto deposition substrate 52 according to the pattern defined in flexible aperture mask 10K. In some cases, flexible aperture mask 10K may be removed and repositioned in order to achieve proper placement of flexible aperture mask 10K relative to deposition substrate 52 for the deposition process.

Another way to control sag is to use magnetic force. For example, referring again to FIG 1a, aperture mask 10A may comprise both a polymer and magnetic material. The magnetic material may be coated or laminated on the polymer, or can be impregnated into the polymer. For example, magnetic particles may be dispersed within a polymeric material used to form aperture mask 10A. When a magnetic force is used, a magnetic field can be applied within a deposition station to attract or repel the magnetic material in a manner that controls sag in aperture mask 10A.

Figure 8:
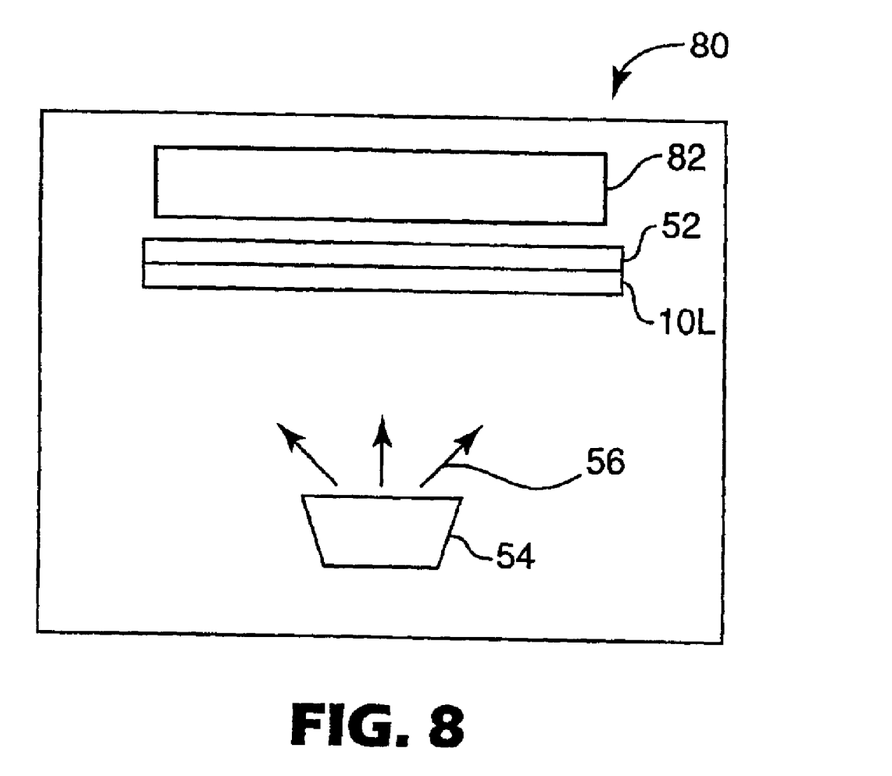

For example, as illustrated in FIG. 8, a deposition station 80 may include magnetic structure 82. Aperture mask 10L may include a magnetic material. Magnetic structure 82 may attract aperture mask 10L so as to reduce, eliminate, or otherwise control sag in aperture mask 10L. Alternatively, magnetic structure 82 may be positioned such that sag is controlled by repelling the magnetic material within aperture mask 10L. In that case magnetic structure 82 would be positioned on the side of aperture mask 10L opposite deposition substrate 52. For example, magnetic structure 82 can be realized by an array of permanent magnets or electromagnets.

Another way to control sag is the use of electrostatics. In that case, the aperture mask may comprise a polymer that is electrostatically coated or treated. Although magnetic structure 82 (FIG. 8) may not be necessary if an electrostatic coating is used to control sag, it may be helpful in some cases where electrostatics are used. A charge may be applied to the aperture mask, the deposition substrate, or both to promote electrostatic attraction in a manner that promotes a sag reduction.

Still another way to control sag is to stretch the aperture mask. In that case a stretching unit can be implemented to stretch the aperture mask by an amount sufficient to reduce, eliminate, or otherwise control sag. As the mask is stretched tightly, sag is reduced. In that case, the aperture mask may need to have an acceptable coefficient of elasticity.

Figure 9A:
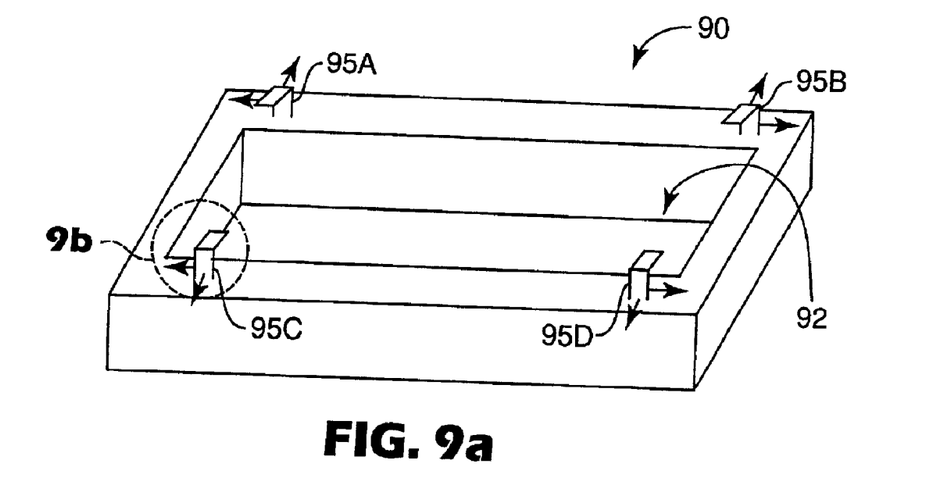
FIG. 9a is a perspective view of one exemplary stretching unit for stretching aperture masks in accordance with the invention.

Additionally, the concept of stretching a polymeric aperture mask can also be used to properly align the aperture mask for a deposition process. FIG. 9a is a perspective view of an exemplary stretching unit for stretching aperture masks in accordance with the invention. Stretching unit 90 may include a relatively large deposition hole 92. An aperture mask can cover deposition hole 92 and a deposition substrate can be placed in proximity with the aperture mask. In order to allow ease of alignment using stretching, the aperture mask should allow elastic stretching without damage. Thus, the amount of stretching in one or more directions may be greater than approximately 0.1 percent, greater than approximately 0.5 percent, or even greater than approximately 1 percent. Material can be vaporized through deposition hole 92, and deposited on the deposition substrate according to the pattern defined in the aperture mask.

Figure 9B:
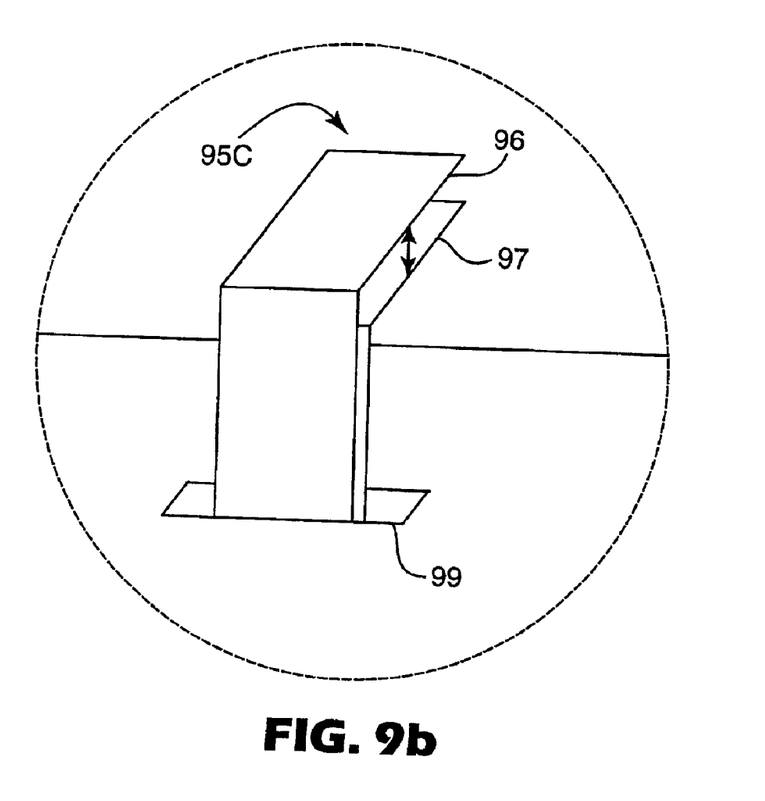
FIG. 9b is an enlarged view of a stretching mechanism.

Stretching unit 90 may include a number of stretching mechanisms 95A, 95B, 95C and 95D. Each stretching mechanism 95 may protrude up through a stretching mechanism hole 99 shown in FIG. 9b. In one specific example, each stretching mechanism 95 includes a top clamp portion 96 and a bottom clamp portion 97 that can clamp together upon an aperture mask. The aperture mask can then be stretched by moving stretching mechanisms 95 away from one another as they clamp the aperture mask. Stretching mechanisms 95 may move in directions along one or more axes. Stretching mechanisms 95 are illustrated as protruding from the top of stretching unit 90, but could alternatively protrude from the bottom of stretching unit. Particularly, if stretching unit 90 is used to control sag in an aperture mask, the stretching mechanisms would typically protrude from the bottom of stretching unit 90. Alternative methods of stretching the aperture mask could also be used either to control sag in the aperture mask or to properly align the aperture mask for the deposition process. By stretching the aperture mask, misalignment due to thermal expansion can be greatly minimized.

Figure 10:
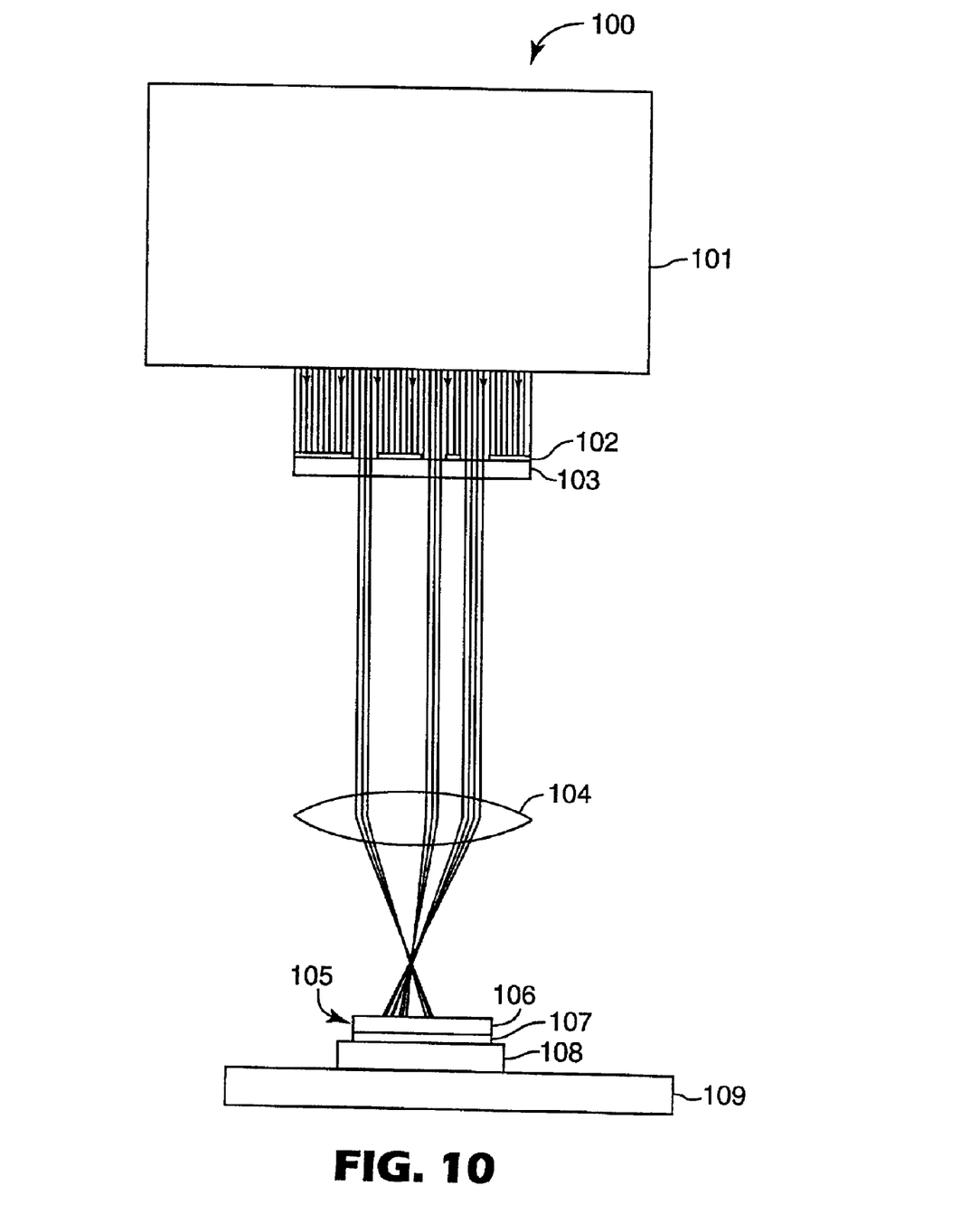
FIG. 10 is a block diagram of a laser ablation system that can be used to ablate aperture masks in accordance with the invention.

As mentioned above, laser ablation techniques can be used to create the pattern of deposition apertures in a polymeric aperture mask, for example, by ablating a polymeric film to define the pattern of deposition apertures. In some cases, the pattern may define first and second pattern elements separated by more than approximately 25 centimeters. FIG. 10 is a block diagram of a laser ablation system that can be used to ablate aperture masks in accordance with the invention. Laser ablation techniques are advantageous because they can achieve relatively small deposition apertures and can also define patterns on a single aperture mask that are much larger than conventional patterns. In addition, laser ablation techniques may facilitate the creation of aperture masks at significantly lower cost than other conventional techniques commonly used to create metal or silicon aperture masks.

As illustrated in FIG. 10, laser ablation system 100 may be a projection laser ablation system utilizing a patterned ablation mask, although a shadow mask ablation system or phase mask ablation system could be used. Spot-writing a single laser spot can also be used to "write" the desired pattern of apertures. Projection imaging laser ablation is a technique for producing very small parts or very small structures on a surface of an object being ablated, the structures having sizes on the order of between one micron to several millimeters, whereby light is passed through a patterned ablation mask and the pattern is imaged onto the object being ablated. Material is removed from the ablation substrate in the areas that receive light. Although the system is described using an ultraviolet (UV) laser, the illumination provided by the laser can be any kind of light, such as infrared or visible light. Moreover, the invention may be applied using light sources that are not lasers.

Laser 101 may be a KrF excimer laser emitting a beam with a short wavelength of light of approximately 248 nm. However, any type of excimer laser may be used, such as $F_2$, ArF, KrCl, or XeCl type excimer lasers. An excimer laser is particularly useful in creating small deposition apertures because an excimer laser can resolve smaller features and cause less collateral damage than lasers such as $CO_2$ lasers, which emit beams with a wavelength of approximately 10,600 nm. Also, excimer lasers can be used with most polymers that are transparent to light from lasers typically used for processing metals, such as Neodymium doped Yttrium Aluminum Garnet (Nd:YAG) lasers. Excimer lasers are also advantageous because at UV wavelengths, most materials, such as polymers, have high absorption. Therefore, more energy is concentrated in a shallower depth and the excimer laser provides cleaner cutting. Excimer lasers are pulsed lasers, the pulses ranging from 5–300 nanoseconds. Laser 101 may also be a tripled or quadrupled Nd:YAG laser or any laser having pulses in the femtosecond range.

Ablation mask 103 may be a patterned mask having pattern 102 manufactured using standard semiconductor lithography mask techniques. The patterned portions of ablation mask 103 are opaque to UV light, while a support substrate of ablation mask are transparent to UV light. In one embodiment, the patterned portions comprise aluminum while the support substrate for ablation mask 103 is fused silica ($SiO_2$). Fused silica is a useful support material because it is one of the few materials that is transparent to mid and far UV wavelengths. Calcium fluoride may be used as the support substrate as an alternative to $SiO_2$. Aluminum is useful as a patterning material because it reflects mid-UV light. A patterned dielectric stack is one alternative to aluminum.

Imaging lens 104 may be a single lens or an entire optical system consisting of a number of lenses and other optical components. Imaging lens 104 projects an image of the ablation mask, more specifically, an image of the pattern of light passing through the ablation mask onto surface of object to be ablated 105. The object to be ablated is a polymeric film 106, possibly including a material 107 formed on the back side of the polymeric film. Some suitable polymeric films may comprise polyimide, polyester, polystyrene, polymethyl methacrylate, polycarbonate, or combinations thereof.

Figure 11:
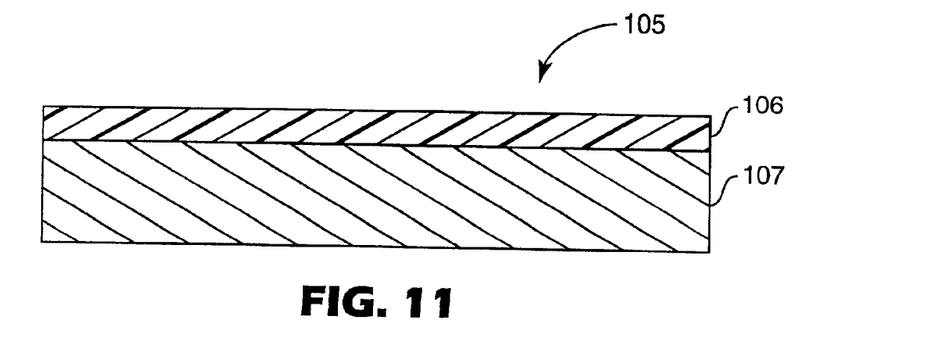
FIG. 11 is a cross-sectional side view of a polymeric film formed with a material on a first side.

FIG. 11 illustrates a useful structure that can form the object to be ablated 105. Specifically, FIG. 11 illustrates an object to be ablated 105 that includes a polymer film 106 with a material 107 formed on the back side, i.e. a side opposite the side incident to the laser in system 100 (FIG. 10). Material 107 provides an etch stop for the ablation process which can avoid air entrapment under polymer film 106, and can be a stabilizing carrier. For example, material 107 may comprise a metal such as copper.

After the ablation is complete, material 107 is etched from polymer film 106, to form a polymeric aperture mask. Alternatively, in some embodiments, material 107 may be peeled away. Objects 105 may be created by forming a copper layer on a polymer film, or by forming the polymer film on a copper layer. In some cases, objects 105 may simply be purchased in a preformed configuration.

Referring again to FIG. 10, table 109 supports and positions the object to be ablated 105. For example, object to be ablated 105 can be fixed into position on table 109, such as by vacuum chuck 108, static electricity, mechanical fasteners or a weight. Table 109 can position the object to be ablated 105 by moving the object 105 on the x, y and z axes as well as rotationally, such as along the z axis. Table 109 can move object 105 in steps down to approximately 5 nm, and more typically, approximately 100 nm, reproducible to an accuracy of approximately 500 nm. Computer control of table 109 can allow preprogramming of the movement of table 109 as well as possible synchronization of table movement with the emission of light from laser 101. The table may also be manually controlled, such as with a joystick connected to a computer.

In creating aperture masks for integrated circuit fabrication, it can be advantageous to control the wall angle of the ablated deposition apertures so that the deposition apertures are suitable for material to be deposited through them. In an embodiment of the invention, the ablation is controlled to obtain an acceptable wall angle. Accordingly, the invention may control the ablation so as to achieve an acceptable wall angle. A straight wall angle, i.e., a zero (0) degree wall angle, corresponds to a deposition aperture having walls that are perpendicular to the surface of the polymer film. In some cases, even a negative wall angle can be achieved, wherein the hole assumes a larger and larger diameter as the laser ablates through the polymer material.

A number of factors can affect the wall angle. Accordingly these factors can be controlled to achieve an acceptable, or a desired wall angle. For example, the power density of the laser radiation at the substrate and the numerical aperture of the imaging system can be controlled to achieve an acceptable wall angle. Additional factors that may be controlled include the pulse length of the laser, and the ablation threshold of the object or material being ablated. In general, the aperture wall angle should be near zero to allow the closest possible spacing between apertures. However, if a large aperture mask is used in a deposition process with a small source, e.g., electron beam evaporation, a wall angle greater than zero is desirable to minimize parallax in regions of the mask where the deposition flux impinges the deposition substrate at an angle substantially different from perpendicular.

Figure 12:
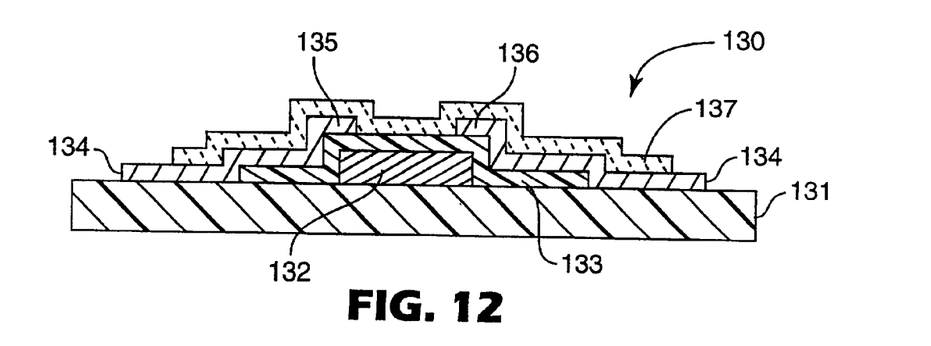
FIGS. 12 and 13 are cross-sectional views of exemplary thin film transistors that can be created according to the invention.
Figure 13:
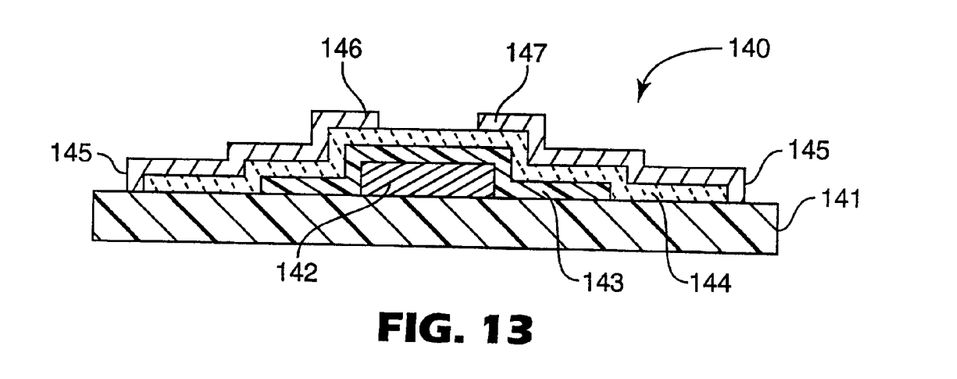

FIGS. 12 and 13 are cross-sectional views of exemplary thin film transistors that can be created according to the invention. In accordance with the invention, thin film transistors 130 and 140 can be created without using any etching or lithography techniques. Instead, thin film transistors 130 and 140 can be created solely using aperture mask deposition techniques as described herein. Alternatively, one or more bottom layers may be etched or lithographically patterned, with at least two of the top most layers being formed by the aperture mask deposition techniques described herein. Importantly, the deposition techniques achieve sufficiently small circuit features in the thin film transistors. In addition, if an organic semiconductor is used, the invention can facilitate the creation of thin film transistors in which the organic semiconductor is not the top-most layer of the circuit. Rather, in the absence of wet processing, electrode patterns may be formed over the organic semiconductor material. Electrode patterns formed over the organic semiconductor often result in thin film transistors with improved device characteristics. This advantage of aperture mask 10 can be exploited while at the same time achieving acceptable sizes of the circuit elements.

Thin film transistors are commonly implemented in a variety of different circuits, including for example, RFID circuits, electronic memory, and other low cost circuits. In addition, thin film transistors can be used as control elements for liquid crystal display pixels, or other flat panel display pixels, including organic light emitting diodes. Many other applications for thin film transistors also exist.

As shown in FIG. 12, thin film transistor 130 is formed on a deposition substrate 131. Thin film transistor 130 represents one embodiment of a transistor in which all of the layers are deposited using an aperture mask and none of the layers are formed using etching or lithography techniques. The aperture mask deposition techniques described herein can enable the creation of thin film transistor 130 in which a distance between electrodes 135 and 136 is less than approximately 1000 microns, less than approximately 50 microns, less than approximately 20 microns, or even less than approximately 10 microns, while at the same time avoiding conventional etching or lithography processes.

In particular, thin film transistor 130 includes a first deposited conductive layer 132 formed over deposition substrate 131. A deposited dielectric layer 133 is formed over first conductive layer 132. A second deposited conductive layer 134 defining source electrode 135 and drain electrode 136 is formed over deposited dielectric layer 133. A deposited active layer 137, such as a deposited semiconductor layer, or a deposited organic semiconductor layer is formed over second deposited conductive layer 134. Deposition techniques using mask set 40, for example, represent one exemplary method of creating thin film transistor 130. In that case, each layer of thin film transistor 130 may be defined by one or more deposition apertures in deposition aperture masks 10D–10I that form mask set 40. Alternatively, one or more of the layers of the thin film transistor may be created using a number of aperture masks and stitching techniques, as mentioned above.

By forming deposition apertures 14 in masks 10 to be sufficiently small, one or more features of thin film transistor 130 can be made with a width less than approximately 1000 microns, less than approximately 50 microns less than approximately 20 microns, less than approximately 10 microns, or even less than approximately 5 microns. Moreover, by forming a gap in an aperture mask to be sufficiently small, other features such as the distance between source electrode 135 and drain electrode 136 can be made less than approximately 1000 microns, less than approximately 50 microns less than approximately 20 microns or even less than approximately 10 microns. In that case, a single mask may be used to deposit second conductive layer 134, with each of the two electrodes 135, 136 being defined by deposition apertures separated by a sufficiently small gap. In this manner, the size of thin film transistor 130 can be reduced, enabling fabrication of smaller, higher density circuitry while maintaining the performance of thin film transistor 130. Additionally, a circuit comprising two or more transistors can be formed by an aperture mask having two deposition apertures separated by a large distance, as illustrated in FIGS. 2 and 3.

FIG. 13 illustrates another embodiment of a thin film transistor 140. In particular, thin film transistor 140 includes a first deposited conductive layer 142 formed over deposition substrate 141. A deposited dielectric layer 143 is formed over first conductive layer 142. A deposited active layer 144, such as a deposited semiconductor layer, or a deposited organic semiconductor layer is formed over deposited dielectric layer 143. A second deposited conductive layer 145 defining source electrode 146 and drain electrode 147 is formed over deposited active layer 144.

Again, by forming deposition apertures 14 in masks 10 to be sufficiently small, one or more features of thin film transistor 140 can have widths on the order of those discussed herein. Also, by forming a gap in an aperture mask to be sufficiently small, the distance between source electrode 146 and drain electrode 147 can be on the order of the gaps discussed herein. In that case, a single mask may be used to deposit second conductive layer 145, with each of the two electrodes 146, 147 being defined by deposition apertures separated by a sufficiently small gap. In this manner, the size of thin film transistor 140 can be reduced, and the performance of thin film transistor 140 can be improved.

For example, thin film transistors implementing organic semiconductors may take the form of FIG. 12 because organic semiconductors typically cannot be etched or lithographically patterned without damaging or degrading the performance of the organic semiconductor material. For instance, morphological changes can occur in an organic semiconductor layer upon exposure to processing solvents. For this reason, fabrication techniques in which the organic semiconductor is deposited as a top layer are commonly used.

By forming at least the top two layers of the thin film transistor using aperture mask deposition techniques, the invention facilitates the configuration of FIG. 13, even if active layer 144 is an organic semiconductor layer. The configuration of FIG. 13 can promote improved growth of the organic semiconductor layer by allowing the organic semiconductor layer to be deposited over the relatively flat surface of dielectric layer 143, as opposed to being deposited over the non-continuous second conductive layer 134 as illustrated in FIG. 12. For example, if the organic semiconductor material is deposited over a non-flat surface, growth can be inhibited. Thus, to avoid inhibited organic semiconductor growth, the configuration of FIG. 13 may be desirable. In some embodiments, all of the layers may be deposited as described above. Also, the configuration of FIG. 13 is advantageous because depositing appropriate source and drain electrodes on the organic semiconductor provides low-resistance interfaces. Additionally, circuits having two or more transistors separated by a large distance can also be created, for example, using masks like those illustrated in FIGS. 2 and 3.

An additional advantage of this invention is that an aperture mask may be used to deposit a patterned active layer which may enhance device performance, particularly in cases where the active layer comprises an organic semiconductor, for which conventional patterning processes are incompatible. In general, the semiconductor may be amorphous (e.g., amorphous silicon) or polycrystalline (e.g., pentacene).

One particular technique for creating a circuit or a circuit element includes positioning an aperture mask. For example, the mask may be positioned in proximity to a deposition substrate. In some cases, the mask may be placed in intimate contact with the deposition substrate, and in other cases, it can be advantageous to maintain a small gap between the deposition substrate and the aperture mask. The aperture mask can then be stretched. Stretching the aperture mask can achieve one or more of a number of different goals. For example, stretching the aperture mask can reduce sag in the mask. Alternatively or additionally, stretching the aperture mask can align the mask for the deposition process. After stretching the aperture mask, material can be deposited through the aperture mask onto the deposition substrate to form a layer on the deposition substrate. The layer may comprise a layer in an integrated circuit, including, for example, a layer in a thin film transistor, a diode, or a radio frequency identification circuit. The diode may be a light emitting diode, including an organic light emitting diode.

Another technique of creating a circuit or a circuit element includes positioning an aperture mask and controlling sag in the aperture mask. The aperture mask may be positioned in proximity to a deposition substrate. Again, in some cases, the mask may be placed in intimate contact with the deposition substrate, and in other cases, it can be advantageous to maintain a small gap between the deposition substrate and the aperture mask. Controlling sag can be performed in a number of ways including using magnetic force, electrostatics, stretching techniques, or adhering the mask to the deposition substrate such as with a pressure sensitive adhesive.

In one technique for creating an aperture mask, a material layer is formed on a first side of a polymeric film. Alternatively, the polymeric film may be formed on the material. The material may comprise a metal such as copper. Once formed, the polymeric film can be ablated from a side opposite the material layer, and the material layer can be removed. For example, if the material layer is metallic, it can be removed by etching or peeling away the metal. In this manner, a polymeric aperture mask can be fabricated.

A repositionable polymeric aperture mask can also be used as a pattern in an etching process, including a process to etch at least one layer of a thin film transistor. Then, the same repositionable polymeric aperture mask can be reused as a pattern in another etching process. This technique can simplify a large scale repeated etching process, and also reduce the cost of implementing the same etching process a number of times.

In another technique, if an aperture mask is made flexible, it can facilitate the creation of integrated circuits on a non-planar deposition substrate. A flexible and repositionable aperture mask can be positioned over the non-planar deposition substrate. Then, a layer or a portion of a layer of an integrated circuit can be formed on the non-planar deposition substrate. The layer of the integrated circuit may comprise at least a portion of a thin film transistor. The aperture masks described herein can be particularly useful when the deposition process requires intimate contact between the aperture mask and the deposition substrate. In that case, flexible polymeric aperture masks can conform to the surface of the non-planar substrate to facilitate the intimate contact.

In another technique for creating an aperture mask, a pattern is ablated in a polymeric film to create a free-standing aperture mask. In that case, ablation can be controlled to create an acceptable wall-angle. For example, a number of factors that can affect the wall angle are listed above, such as the power density of the laser, the numerical aperture of the imaging system, the pulse length of the laser, and the ablation threshold of the object or material being ablated. One or more of these factors can be controlled as desired to ensure that an acceptable wall angle is achieved.

Figure 14:
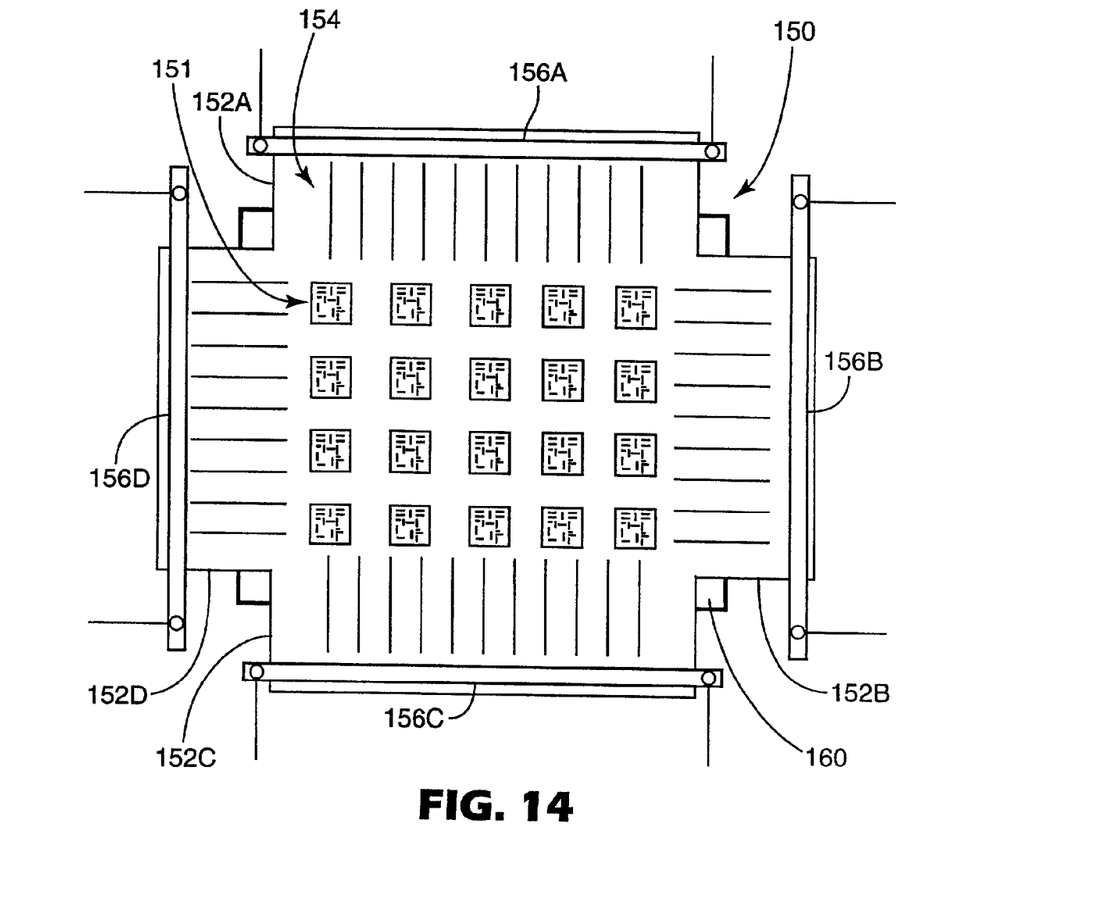
FIG. 14 is a top view of one embodiment of an aperture mask being stretched in accordance with the invention.

FIG. 14 is a top view of an aperture mask being stretched in accordance with the invention. Aperture mask 150 comprises a mask substrate formed with pattern 151 as described above. As illustrated, aperture mask 150 may include extension portions 152A–152D of the mask substrate that can be used to stretch aperture mask 150 and to improve uniformity of the stretching of pattern 151 without distortion. Each extension portion 152 may include a set of distortion minimizing features, such as slits (only distortion minimizing features 154 labeled), which may be located near the edge of pattern 151. The distortion minimizing features 154 can facilitate more precise stretching of aperture mask 150 by reducing distortion of pattern 151 during stretching. Various configurations of distortion minimizing features include slits in the mask substrate, holes in the mask substrate, perforations in the mask substrate, reduced thickness areas in the mask substrate, and the like.

Clamps 156A–156D can be mounted on extension portions 152 of aperture mask 150. Each clamp 156 may be attached to one or more wires, strings, or the like. In FIG. 14, each clamp 156 includes two strings, thus providing a total of eight degrees of freedom during stretching. The strings can be attached to micrometers mounted on an alignment backing structure. Tension in the strings can be adjusted to provide positioning and a desired amount of stretching of aperture mask 150. In this manner, mask 150 can be aligned with deposition substrate 160.

EXAMPLE 1

In this example, organic integrated circuits were fabricated using four vacuum deposition steps, and four stretched polymer aperture masks. The process used no photolithography and no wet processing.

All four polymer aperture masks were made with the same technique, which involved laser ablation of apertures in 25 micron thick sheets of polyimide with copper backing that was approximately 18 microns thick. After the laser ablation, the copper was removed in an acid etchant, 10 $HNO_3$:1 HCl, and the mask was rinsed and cleaned. In each mask, the patterned region was approximately 4.5 cm×4.5 cm.

Four layers were patterned using the aperture masks including: (1) gate metal, (2) insulator (dielectric), (3) semiconductor, and (4) source/drain metal. Interconnections between circuit components were made by stitching traces in the gate and source/drain layers. In this example, the integrated circuit was designed with minimum line widths of 15 microns.

Each of the masks was mounted between four clamps as shown in FIG. 14. Stretching and alignment were accomplished using the eight strings that were attached to the ends of clamps 156. Each of the strings was connected to a micrometer mounted on an alignment structure. Each clamp allowed tension to be applied uniformly along one side of the mask. By using at least five (in this case eight) or more degrees of freedom, the elasticity of the mask was used to achieve excellent alignment over the entire patterned area.

In order to reduce distortion of the mask, distortion minimizing features 154, in the form of slits, were cut through the mask on each side between the patterned region and the clamp. The slits ran parallel to the direction of tension applied by the adjacent clamp 156, and in this example were spaced approximately 2.5 mm apart from each other, although the invention is not limited in that respect. The slits, located near the patterned region, allowed the patterned region of the mask to stretch in the direction perpendicular to the slits with very little constraint by clamps 156. In other words, the patterned region was allowed to stretch uniformly in all directions.

In this example, a 50 mm×75 mm×0.7 mm float glass deposition substrate was placed in contact with the first mask with minimal downward force so as to minimize stiction and friction. The first mask was stretched about 0.5% in both directions. The mask, stretching mechanisms and substrate were placed in a vacuum system and the first layer, 50 nm of Pd, was deposited by ion beam sputtering. Electron beam evaporation could also be used.

The assembly was removed and the first mask was replaced with the second mask. The second mask was stretched and aligned to features of the first layer on the substrate. The assembly was placed in a vacuum system and the second layer, 200 nm of $Al_2O_3$, was deposited by electron-beam evaporation. Sputtering could also be used.

The assembly was again removed and the second mask was replaced with the third mask. The third mask was stretched and aligned to features of the first layer on the substrate. The assembly was placed in a vacuum system and the third layer, 50 nm of pentacene, was deposited by thermal evaporation.

The assembly was removed again and the third mask was replaced with the fourth mask. The fourth mask was stretched and aligned to features of the first layer on the substrate. The assembly was placed in a vacuum system and the fourth layer, 150 nm of Au, was deposited by thermal evaporation. Sputtering or electron beam evaporation could also be used.

Finally, the assembly was removed from the vacuum system and the substrate was removed from the assembly. At this point, the resultant integrated circuit was tested and shown to be functional.

EXAMPLE 2

Electronic displays consisting of subpixels of red, green and blue organic light emitting diodes are also enabled by the use of a stretched polymer mask. The driving circuitry for the Organic Light Emitting Diode (OLED) subpixels is provided on the substrate, and can be either active matrix or passive matrix, both of which are known in the art. The driving circuitry includes electrodes (for example, indium tin oxide anodes) for the OLED subpixels. The substrate may also include spacers of, for example, photoresist of height 0.1 to 10 microns which hold the aperture mask away from the substrate surface to prevent damage to materials on the substrate when the mask is moved.

In this example, the mask pattern is a series of rectangular apertures in a rectangular array, formed by laser ablation. The apertures are, for example, 100 microns square, and are spaced 250 microns center-to-center in both dimensions. The OLED subpixels are made by optionally first depositing a buffer layer, such as polythiophene (e.g., Baytron P from Bayer) over all of the electrodes by spin coating. Alternatively, buffer layers may be vacuum deposited. Next, a hole transport layer, such as 40 nm NPD (N,N'-Di(naphthalen-1-yl)-N,N'diphenylbenzidine) is vacuum evaporated over the buffer layer.

Next, the aperture mask is stretched as in the previous example and aligned to the electrodes for the red subpixels. The red electroluminescent layer is then deposited through the aperture mask. This layer may be, for example, 10 nm of a mixture of 10 weight percent PtOEP (platinum octaethylporphyrin) in CBP (4,4'-Bis(carbazol-9-yl)biphenyl), formed by simultaneously evaporation PtOEP and CBP from two sources.

The aperture mask is then moved, possibly while still in the vacuum, to be aligned with the electrodes for the green subpixels. The green electroluminescent layer is then vacuum deposited through the aperture mask. This layer may be, for example, 10 nm of a mixture of 10 weight percent Ir(ppy)$_3$ (tris(2-phenylpyridine)iridium) in CBP. The mask is then moved, possibly while still in the vacuum, to be aligned with the electrodes for the blue subpixels. The blue electroluminescent layer is then vacuum deposited through the aperture mask. This layer may be, for example, 10 nm CBP. Optionally, a blue dopant, such as perylene (10 weight percent in CBP), may be used.

Next, the mask is removed, possibly while still in the vacuum. An electron transporting layer is then vacuum deposited. This layer may be, for example, 50 nm of BAlq ((1,1'-Bisphenyl-4-Olato)bis(2-methyl-8-quinolinolato)Aluminum). Finally, in the case of an active matrix display, a cathode is deposited over all of the subpixels. The cathode may be, for example, 0.5 nm of LiF followed by 200 nm of Al. In the case of a passive matrix display, the cathodes must be patterned into rows, typically by using another shadow mask.

A number of embodiments of the invention have been described. For example, a number of different structural components and different deposition techniques have been described. The deposition techniques can be used to create various different circuits solely using deposition, avoiding any chemical etching processes or photolithography, which is particularly useful when organic semiconductors are involved. Nevertheless, it is understood that various modifications can be made without departing from the spirit and scope of the invention. For example, although some aspects of the invention have been described for use in a thermal vapor deposition process, the techniques and structural apparatuses described herein could be used with any deposition process including sputtering, thermal evaporation and electron beam evaporation and pulsed laser deposition. Thus, these other embodiments are within the scope of the following claims.

What is claimed is:

1. A method comprising:

positioning a repositionable polymeric aperture mask in proximity to a deposition substrate;

stretching the aperture mask to align the aperture mask with the deposition substrate; and depositing material through the stretched aperture mask to form a layer on the deposition substrate.

2. The method of claim 1, wherein stretching the aperture mask comprises stretching the aperture mask into alignment with one or more features on the deposition substrate.

3. The method of claim 1, further comprising positioning the aperture mask under the deposition substrate, wherein stretching the aperture mask reduces sag in the aperture mask.

4. The method of claim 1, wherein the layer on the deposition substrate comprises a layer in an integrated circuit.

5. The method of claims 4, wherein the layer in the integrated circuit comprises a layer in an organic light emitting diode.

6. The method of claim 4, wherein the layer in the integrated circuit comprises a layer in a radio frequency identification circuit.

7. A method comprising depositing material on a deposition substrate through a repositionable polymeric aperture mask to define a patterned layer of an integrated circuit, wherein the aperture mask includes a patterned area with a dimension greater than a centimeter, and wherein the patterned layer of the integrated circuit comprises at least a portion of a thin film transistor.

8. The method of claim 7, wherein the repositionable polymeric aperture mask is formed with at least one deposition aperture having a width less than approximately 1000 microns.

9. The method of claim 7, wherein the repositionable polymeric aperture mask is formed with at least one deposition aperture having a width less than approximately 50 microns.

10. The method of claim 7, further comprising sequentially depositing a number of materials on the deposition substrate through a number of repositionable polymeric aperture masks to define an integrated circuit.

* * * * *